United States Patent
Navarro et al.

(10) Patent No.: US 9,527,108 B2
(45) Date of Patent: Dec. 27, 2016

(54) METHOD FOR PREPARING SURFACES

(71) Applicants: ARKEMA FRANCE, Colombes (FR); COMMISSARIAT A L'ENERGIE ATOMIQUE ET AUX ENERGIES ALTERNATIVES, Paris (FR)

(72) Inventors: Christophe Navarro, Lahonce (FR); Stéphanie Magnet, Morlanne (FR); Xavier Chevalier, Grenoble (FR); Raluca Tiron, Saint-Martin-le-Vinoux (FR); Christophe Couderc, Saint-Martin-d'Hères (FR)

(73) Assignees: ARKEMA FRANCE, Paris (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 54 days.

(21) Appl. No.: 14/363,868

(22) PCT Filed: Dec. 5, 2012

(86) PCT No.: PCT/FR2012/052813
§ 371 (c)(1),
(2) Date: Jun. 9, 2014

(87) PCT Pub. No.: WO2013/083919
PCT Pub. Date: Jun. 13, 2013

(65) Prior Publication Data
US 2014/0370198 A1 Dec. 18, 2014

Related U.S. Application Data

(60) Provisional application No. 61/603,563, filed on Feb. 27, 2012.

(30) Foreign Application Priority Data

Dec. 9, 2011 (FR) .................................... 11 61423

(51) Int. Cl.
*B05D 3/10* (2006.01)
*C08F 293/00* (2006.01)
(Continued)

(52) U.S. Cl.
CPC ............. *B05D 3/108* (2013.01); *B05D 3/0254* (2013.01); *B05D 3/06* (2013.01); *B05D 5/00* (2013.01);
(Continued)

(58) Field of Classification Search
CPC combination set(s) only.
See application file for complete search history.

(56) References Cited

U.S. PATENT DOCUMENTS 6,255,422 B1 * 7/2001 Bertin .................. C08F 2/38
522/17
2011/0147984 A1 * 6/2011 Cheng .................. B82Y 10/00
264/220

(Continued)

OTHER PUBLICATIONS

Charleux et al, Macromolecules, 38, pp. 5485-5492, 2005.*
(Continued)

*Primary Examiner* — Erma Cameron
(74) *Attorney, Agent, or Firm* — RatnerPrestia

(57) ABSTRACT

The invention relates to a surface preparation method using a combination of at least two polymers, which are the same or different, which are grafted hierarchically or multiply on a surface, and also to the use of this preparation method, more particularly in applications for controlling the surface energy of a substrate. The invention may allow a block polymer to be structured with a minimum of defects.

20 Claims, 3 Drawing Sheets

(51) Int. Cl.
| | |
|---|---|
| C09D 153/00 | (2006.01) |
| C09D 125/14 | (2006.01) |
| G03F 7/16 | (2006.01) |
| B05D 7/00 | (2006.01) |
| C09D 125/08 | (2006.01) |
| C09D 133/04 | (2006.01) |
| C09D 133/10 | (2006.01) |
| B05D 3/02 | (2006.01) |
| B05D 3/06 | (2006.01) |
| B05D 5/00 | (2006.01) |
| G03F 7/00 | (2006.01) |

(52) U.S. Cl.
CPC . *B05D 7/52* (2013.01); *B05D 7/56* (2013.01); *C08F 293/005* (2013.01); *C09D 125/08* (2013.01); *C09D 125/14* (2013.01); *C09D 133/04* (2013.01); *C09D 133/10* (2013.01); *C09D 153/00* (2013.01); *G03F 7/0002* (2013.01); *G03F 7/16* (2013.01); *C08F 2438/02* (2013.01)

(56) References Cited

U.S. PATENT DOCUMENTS

| | | | | |
|---|---|---|---|---|
| 2012/0273460 | A1* | 11/2012 | Kang | B82Y 30/00 216/49 |
| 2013/0078576 | A1* | 3/2013 | Wu | C08F 293/00 430/296 |

OTHER PUBLICATIONS

International Search Report of PCT/FR2012/052813 (With English Translation), Issued April 2, 2013.
Aissou, et al, "Phase Behavior in Thin Films of Cylinder-Forming Diblock Copolymer: Deformation and Division of Heptacoordinated Microdomains", Macromolecules, 2007, vol. 40, pp. 5054-5059.
Aksimetiev et al., "Phase behavior of gradient copolymers," J. of Chem. Physics, vol. 111, No. 5, 1999, pp. 2329-2339.
Cheng et al., "Simple and Versatile Methods to Integrate Directed Self-Assembly with Optical Lithography Using a Polarity-Switched Photoresist," ACS Nano, vol. 4, No. 8, Aug. 24, 2010, pp. 4815-4823.
Chevalier et al., "Study and optimization of the parameters governing the block copolymer self-assembly: toward a future integration in lithographic process," Proceedings of spiem vol. 7970, 2011, p. 79700Q to 79700Q-11.
Gray et al., "Gradient Copolymerization of Styrene and 4-Acetoxystyrene Via Nitroxide-Mediated Controlled Radical Polymerization," Polymer Preprints, 2001, vol. 42, No. 2, pp. 337-338.
Han et al., "Effect of Composition of Substrate-Modifying Random Copolymers on the Orientation of Symmetric and Asymmetric Diblock Copolymer Domains," Macromolecules, vol. 41, No. 23, 2008, pp. 9090-9097.
In et al., "Side-Chain-Grafted Random Copolymer Brushes as Neutral Surfaces for Controlling the Orientation of Block Copolymer Microdomains in Thin Films," Langmuir, 2006, vol. 22, No. 18, pp. 7855-7860).
Janco et al., "Rapid determination of molecular parameters of synthetic polymers by precipitation/redissolution high-performance liquid chromatography using "molded" monolithic column," J. Polym. Sci., Part A: Polym. Chem., 2000), vol. 38, No. 15, pp. 2767-2778.
Ji et al., "Generalization of the Use of Random Copolymers to Control the Wetting Behavior of Block Copolymer Films," Macromolecules, vol. 41, No. 23, 2008, pp. 9098-9103.
Jung et al. "Three-Dimensional Multilayered Nanostructures with Controlled Orientation of Microdomains from Cross-Linkable Block Copolymers," ACS Nano, vol. 5, No. 8, 2011, pp. 6164-6173.
Li, et al, "Ordering Dynamics of Directed Self-Assembly of Block Copolymers in Periodic Two-Dimensional Fields", Macromolecules, 2010, vol. 43, pp. 1644-1650.
Liu et al. "Modification of a polystyrene brush layer by insertion of poly(methyl methacrylate) molecules," J. Vac. Sci. Technol. B, vol. 27, No. 6, 2009, pp. 3038-3042.
Mansky, "Controlling Polymer-Surface Interactions with Random Copolymer Brushes", Science, Mar. 7, 1997, 275, pp. 1458-1460.
Mansky et al, "Ordered Diblock Copolymer Films on Random Copolymer Brushes," Macromolecules, 1997, vol. 30, No. 22, pp. 6810-6813 (Abstract only).
Matyjaszewski et al., "Atom Transfer Radical Polymerization," Chem. Rev., 2001, vol. 101, No. 9, pp. 2921-2990.
Matyjaszewski et al., "Gradient copolymers by atom transfer radical copolymerization," J. Phys. Org. Chem., 2000, vol. 13, No. 12, pp. 775-786.
Pakula et al., "Copolymers with controlled distribution of comonomers along the chain, 1 structure, thermodynamics and dynamic properties of gradient copolymers. Computer simulation," Macromol. Theory Simul., vol. 5, 1996, pp. 987-1006.
Segalman, et al, "Graphoepitaxy of Spherical Domain Block Copolymer Films", Advanced Materials, 2001, 13, pp. 1152-1155.
Tiron, et al, "Optimization of block copolymer self-assembly through graphoepitaxy: A defectivity study", J. Vac. Sci. Technology, B, vol. 29, No. 6, 2011, pp. 1-8.
Vu et al., "Controlling domain orientations in thin films of AB and ABA block copolymers," Macromolecules, 2011, vol. 44, No. 15, pp. A-G.
Zaremski et al., "A concept for quasiliving nitroxide-mediated radical copolymerization," Macromolecules, 2000, vol. 33, No. 12, pp. 4365-4372.

* cited by examiner

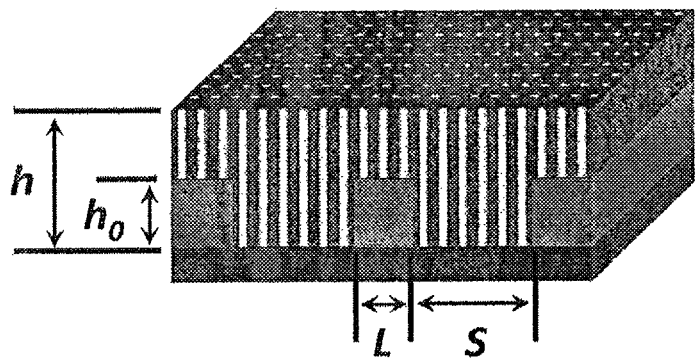
Figure 1
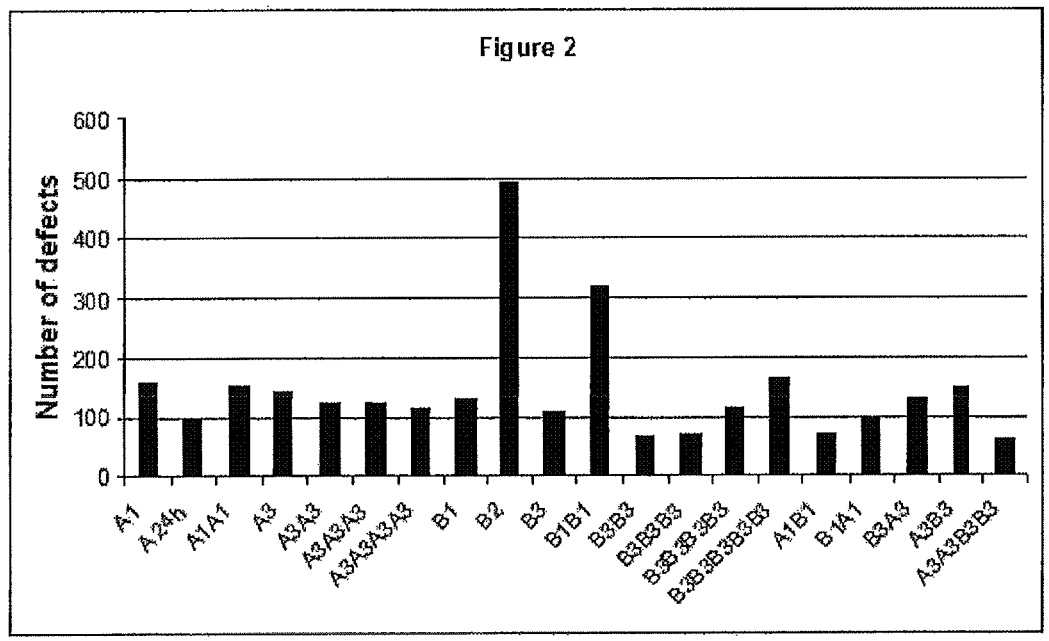

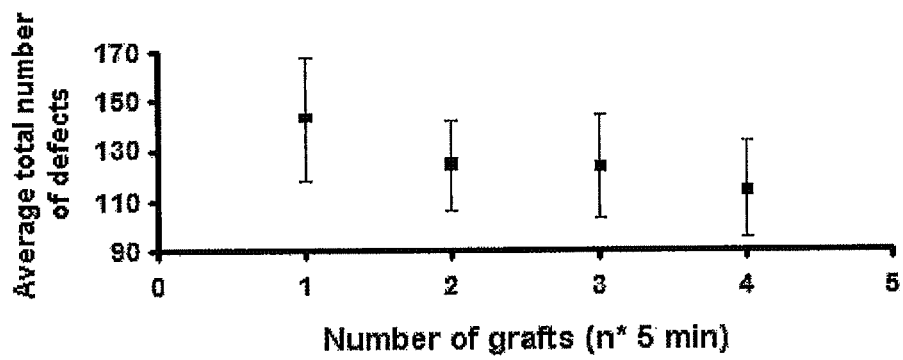
Figure 3: Evolution of the total number of defects as a function of the number of grafts (5 min) carried out with the polymer A
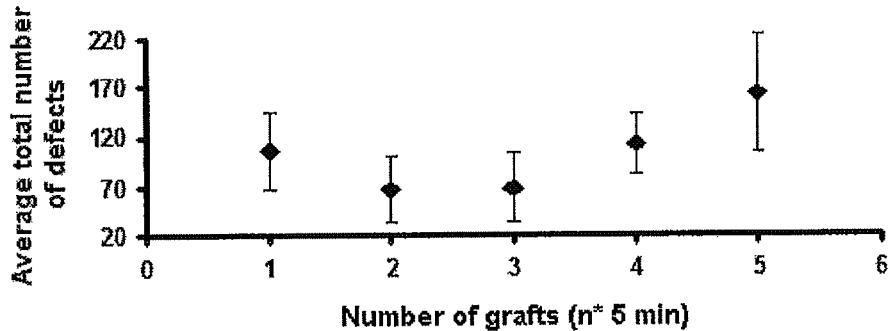
Figure 4: Evolution of the total number of defects as a function of the number of grafts (5 min) carried out with the polymer B

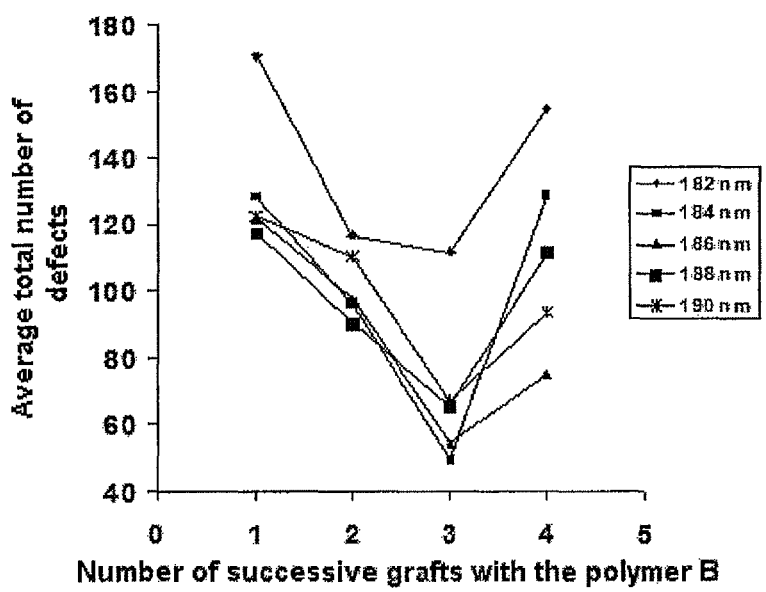
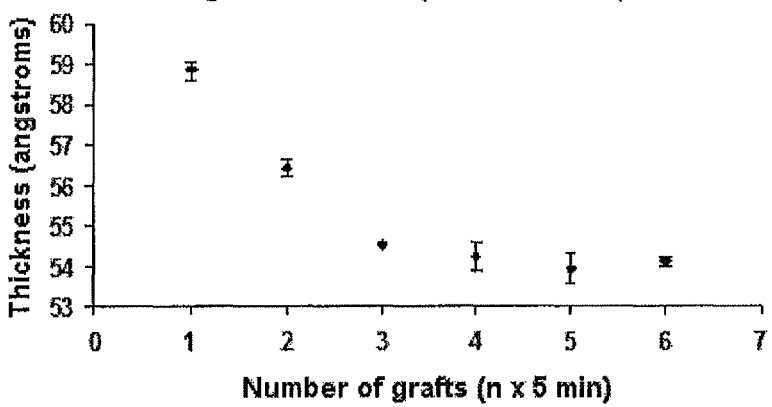

US 9,527,108 B2

METHOD FOR PREPARING SURFACES

CROSS REFERENCE TO RELATED APPLICATIONS

This application is the U.S. National Phase application of PCT International Application No. PCT/FR2012/052813, filed Dec. 5, 2012, and claims priority to French Patent Application No. 1161423, filed Dec. 9, 2011, and claims priority to U.S. Provisional Patent Application No. 61/603,563, the disclosures of all are incorporated by reference in their entirety for all purposes.

FIELD OF THE INVENTION

The invention relates to a new surface preparation method using a combination of at least two polymers, which are different or not, grafted in a hierarchical or multiple manner on one surface.

The invention also relates to the use of this new preparation method, more particularly in applications for controlling the surface energy of a substrate. The invention can make it possible to structure a block polymer with a minimum of defects.

BACKGROUND OF THE INVENTION

The use, by virtue of their capacity to undergo nanostructuring, of block copolymers in the fields of electronics or optoelectronics is now well known. This is illustrated in particular in the article by Cheng et al. (ACS nano, vol. 4, No. 8, 4815-4823, 2010). It is possible more particularly to structure the arrangement of the blocks constituting the copolymers on scales of smaller than 50 nm.

The desired structuring (for example, generation of domains perpendicular to the surface), however, requires the preparation of the substrate to which the block copolymer is applied, for the purpose of controlling the surface energy. Among the possibilities that are known, a polymer, more particularly a random polymer, is applied to the substrate, it being possible for the monomers of said copolymer to be wholly or partly identical with those used in the block copolymer it is desired to apply.

Moreover, if the wish is to prevent, for example, the diffusion of the polymer, it is preferable to graft and/or crosslink the polymer on the surface, through the use of appropriate chemical functionalities. Grafting means the formation of a bond—a covalent bond, for example—between the substrate and the polymer. Crosslinking means the presence of a plurality of bonds between the polymer chains.

When the same polymer is used sequentially, the grafting is designated as multiple. In fact, the grafting of the polymer is repeated several times (application, annealing and solvent rinsing). When polymers of different molecular mass and/or composition are applied, then the grafting is designated as hierarchical. In the latter case, the application of the polymers can be carried out simultaneously or successively.

Among the various possibilities used for orienting the morphology of a block copolymer on a surface, a layer of a random PMMA/PS polymer is applied beforehand to the surface.

Mansky et al. in Science, Vol. 275, pages 1458-1460 (7 Mar. 1997), showed that a random poly(methyl methacrylate-co-styrene) (PMMA/PS) polymer functionalized by a hydroxyl function at the chain end allows effective grafting of the polymer to the surface. The authors attribute the grafting capacity of these polymers to the presence of the terminal hydroxyl group originating from the initiator; this constitutes a condensation grafting mechanism, which is not very effective from the standpoint of the temperature and times that are required, typically 24 to 48 h at 140° C., in this publication.

At a certain molar fraction of the methyl methacrylate and styrene (MMA and STY) monomers, the interface energies of a random polymer with PS and PMMA, respectively, are strictly the same (Mansky et al., Macromolecules 1997, 30, 6810-6813). This situation arises in the case of a silicon support having a fine oxide layer on the surface. In this case, this may present a drawback, since the ideal composition of the random polymer must exhibit exactly this fraction in order for the interface energies with the PS and with the PMMA to be the same. When the composition of the random polymer changes, the authors showed that a PS-PMMA diblock copolymer applied to the random polymer may exhibit morphologies which are dependent on the composition of the random polymer. It is therefore possible to change the morphology of the diblock copolymer in the event of inconsistency of the MMA/STY fraction of the random polymer.

More recently, certain authors (Han et al., Macromolecules, 2008, 9090-9097, Ji et al., Macromolecules, 2008, 9098-9103, Insik In et al., Langmuir, 2006, 22, 7855-7860) have shown that it is possible, advantageously, to enhance the grafting of the random polymer on the surface by introducing—no longer at the chain end but within the random polymer itself—a plurality of functionalities such as hydroxyl or epoxy. In this case, the polymer is grafted by a plurality of functions on the surface (in the case of hydroxyl) and also crosslinked at the surface (in the case of epoxy).

Although the approaches previously described in the literature do allow certain controls over the orientation of a block copolymer on a surface treated with a random polymer, numerous defects of morphology of the block copolymer applied often arise, and are detrimental to industrial applications particularly in the electronics fields.

The applicant has now found that the hierarchical or multiple grafting of at least two polymers of equivalent or non-equivalent composition and of identical or different molecular mass on a surface produces an orientation of a subsequently deposited block copolymer with a minimum of defects, as compared with the grafting of a single layer of polymer. The applicant has observed that the thickness of the layers does not change in the course of the hierarchical or multiple grafting operations, thereby ensuring a consistency in the lithographic parameters until the block copolymer is applied.

Another advantage of the invention relates to the adjustment of the surface energy. When a single polymer is used, as described in the prior art, it corresponds to a given surface energy after deposition, allowing the subsequent deposition of a block copolymer with the same surface energy. However, it is not always easy to have precisely the same surface energy between the polymer used for preparing the surface and the block copolymer which is to be structured. With the present invention, it is possible to modify the surface energy of the first polymer applied to the surface, by means of a second polymer, with a different composition, thereby allowing fine-tuning of the surface energy and hence a better equalization of the surface energies between the polymers used to prepare the surface and the block copolymer which is to be structured. Si Nealey et al. (J. Vac. Sci. Technol. B 27(6), 2009) describe the application of two polymers in succession (a polystyrene then a PMMA), the aim of this application being to adjust the surface energies, without any consideration of the consequence with regard to structuring defects of a block copolymer subsequently deposited on the treated surface.

Similarly, T. Vu et al., in Macromolecules, 2011, 44 (15), pp. 6121-6127 consider the possibility of implementing a second grafting step, without consideration for any consequence for the structuring defects of a block copolymer subsequently deposited on the treated surface.

SUMMARY OF THE INVENTION

The present invention relates to a method for preparing a surface selected from silicon, silicon having a thermal or native oxide layer, germanium, platinum, tungsten, gold, titanium nitrides, graphenes, BARC (bottom anti-reflecting coating) or any other anti-reflective layer used in lithography, utilizing n polymers, which are different or not, n being an integer greater than or equal to 2, said method comprising the following n successive steps:
contacting a solution or dispersion of the polymer i (i adopting the successive integral values from 1 to n) with the surface to be treated, then evaporating the dissolution or dispersion solvent used for contacting the polymer i with the surface to be treated, followed by a step of grafting of the polymer (heat treatment, photochemical treatment, etc.);
repeating the preceding step with the polymer j=i+1 on the surface treated by the polymer i in the preceding step.

BRIEF DESCRIPTION OF THE DRAWINGS

FIG. 1 is a schematic representation of a surface comprising a block copolymer.

FIG. 2 is a graph showing the number of defects for a plurality of grafted polymers.

FIG. 3 is a graph of the total number of defects as a function of the number of grafts carried out with a polymer.

FIG. 4 is a graph of the total number of defects as a function of the number of grafts carried out with a polymer.

FIG. 5 is a graph of the total number of defects observed in spaces of different width as a function of the number of grafts carried out.

FIG. 6 is a graph of the thickness of the grafted layers of a polymer as a function of the number of grafts carried out.

DETAILED DESCRIPTION OF THE INVENTION

The optimum number of grafting steps n is dependent on the molecular mass of the polymers used for grafting. For weight-average molecular masses of less than 10 000 g/mol, n is an integer greater than 1, preferably between 2 and 4, inclusive. More particularly, n is 3, and more preferably n is 2.

For weight-average molecular masses greater than 10 000 g/mol, n is an integer greater than 1, preferably between 3 and 7, inclusive. More particularly, n is between 3 and 6, inclusive, and, even more preferably, n is between 4 and 5, inclusive.

According to a first preferred embodiment of the invention, the grafting takes place multiply. According to a second preferred embodiment of the invention, the grafting takes place hierarchically. According to one alternative of the invention, the grafting is carried out simultaneously with polymers whose weight-average molecular mass exhibits a difference of greater than or equal to 20%, taken two by two.

The nanostructuring of a block copolymer on a surface treated by the method of the invention may take on forms such as cylindrical (hexagonal symmetry (primitive hexagonal network symmetry "6 mm") according to the Hermann-mauguin notation, or tetragonal/square (primitive tetragonal network symmetry "4 mm")), spherical (hexagonal symmetry (primitive hexagonal network symmetry "6 mm" or "6/mmm"), or tetragonal/square (primitive tetragonal network symmetry "4 mm"), or cubic (network symmetry "m⅓m")), lamellar, or gyroidal. The preferred form adopted by the nanostructuring is preferably of the hexagonal cylindrical type.

The process of self-assembly of block copolymers on a surface treated according to the invention is governed by thermodynamic laws. When the self-assembly leads to a cylindrical-type morphology, each cylinder is surrounded by 6 equidistant neighbouring cylinders in the absence of any defect. A number of types of defects may thus be identified. The first type is based on the evaluation of the number of neighbours around a cylinder formed by the arrangement of the block copolymer. If five or seven cylinders surround the cylinder under consideration, a defect will be considered to be present. The second type of defect relates to the average distance between the cylinders surrounding the cylinder under consideration. [W. Li, F. Qiu, Y. Yang, and A. C. Shi, Macromolecules 43, 2644 (2010); K. Aissou, T. Baron, M. Kogelschatz, and A. Pascale, Macromol. 40, 5054 (2007); R. A. Segalman, H. Yokoyama, and E. J. Kramer, Adv. Matter. 13, 1152 (2003); R. A. Segalman, H. Yokoyama, and E. J. Kramer, Adv. Matter. 13, 1152 (2003)]. When this average distance between two neighbours is greater than two % of the average distance between two neighbours, a defect will be considered to be present. In order to determine these two types of defects, it is conventional to use Voronoï constructions and the associated Delaunay triangulations. Following binarization of the image, the centre of each cylinder is identified. Delaunay triangulation then makes it possible to identify the number of first-order neighbours and to calculate the average distance between two neighbours. In this way it is possible to determine the number of defects.

This counting method is described in the article by Tiron et al. (J. Vac. Sci. Technol. B 29(6), 1071-1023, 2011).

By polymer is meant homopolymers, random, block, gradient or comb copolymers with a molecular mass by weight, measured by size exclusion chromatography (SEC), of more than 500 g per mole and consisting of at least one monomer. The polymers used in the method of the invention may be obtained by any route, including polycondensation, ring-opening polymerization, anionic or cationic polymerization or radical polymerization, the latter being controlled or not. When the polymers are prepared by radical polymerization or telomerization, this process may be controlled by any known technique, such as NMP (Nitroxide Mediated Polymerization), RAFT (Reversible Addition and Fragmentation Transfer), ATRP (Atom Transfer Radical Polymerization), INIFERTER (Initiator-Transfer-Termination), RITP (Reverse Iodine Transfer Polymerization) or ITP (Iodine Transfer Polymerization).

Preferably, the copolymers used in the invention are random copolymers, that is to say that they contain at least two different monomers.

Preference will be given to those polymerization processes which do not involve metals. The polymers are prepared preferably by radical polymerization, and more particularly by controlled radical polymerization, even more particularly by nitroxide-controlled polymerization.

More particularly, the nitroxides originating from the alkoxyamines derived from the stable free radical (1) are preferred.

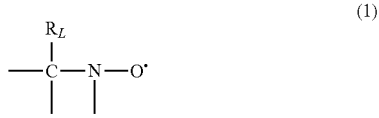

(1)

In this formula, the radical $R_L$ has a molar mass of more than 15.0342 g/mol. The radical $R_L$ may be a halogen atom such as chlorine, bromine or iodine, a saturated or unsaturated, linear, branched or cyclic hydrocarbon group such as an alkyl or phenyl radical, or an ester group —COOR or an alkoxy group —OR, or a phosphonate group —PO(OR)$_2$, provided that it has a molar mass of more than 15.0342. The radical $R_L$, which is monovalent, is said to be in β position relative to the nitrogen atom of the nitroxide radical. The remaining valencies of the carbon atom and of the nitrogen atom in the formula (1) may be bonded to various radicals such as a hydrogen atom, a hydrocarbon radical such as an alkyl, aryl or arylalkyl radical comprising from 1 to 10 carbon atoms. It is not impossible for the carbon atom and the nitrogen atom in the formula (1) to be joined to one another via a divalent radical, so as to form a ring. Preferably, however, the remaining valencies of the carbon atom and of the nitrogen atom in the formula (1) are bonded to monovalent radicals. The radical $R_L$ preferably has a molar mass of more than 30 g/mol. The radical $R_L$ may for example have a molar mass of between 40 and 450 g/mol. As an example, the radical $R_L$ may be a radical comprising a phosphoryl group, it being possible for said radical $R_L$ to be represented by the formula:

(2)

in which $R^3$ and $R^4$, which may be identical or different, may be selected from alkyl, cycloalkyl, alkoxy, aryloxy, aryl, aralkyloxy, perfluoroalkyl and aralkyl radicals and may comprise from 1 to 20 carbon atoms. $R^3$ and/or $R^4$ may also be a halogen atom such as a chlorine or bromine or fluorine or iodine atom. The radical $R_L$ may also comprise at least one aromatic ring, as for the phenyl radical or the naphthyl radical, and the latter radical may be substituted, for example by an alkyl radical comprising from 1 to 4 carbon atoms.

More particularly, the alkoxyamines derived from the following stable radicals are preferred:
N-tert-butyl 1-phenyl-2-methylpropyl nitroxide,
N-tert-butyl 1-(2-naphthyl)-2-methylpropyl nitroxide,
N-tert-butyl 1-diethylphosphono-2,2-dimethylpropyl nitroxide,
N-tert-butyl 1-dibenzylphosphono-2,2-dimethylpropyl nitroxide,
N-phenyl 1-diethylphosphono-2,2-dimethylpropyl nitroxide,
N-phenyl 1-diethylphosphono-1-methylethyl nitroxide,
N-(1-phenyl-2-methylpropyl) 1-diethylphosphono-1-methylethyl nitroxide,
4-oxo-2,2,6,6-tetramethyl-1-piperidinyloxy,
2,4,6-tri-tert-butylphenoxy.

Further to their bond energy, the alkoxyamines used in controlled radical polymerization must allow effective control of the chain sequence of the monomers. Thus, they do not all allow effective control of certain monomers. For example, the alkoxyamines derived from TEMPO do not allow control of more than a limited number of monomers, the same being true for the alkoxyamines derived from 2,2,5-trimethyl-4-phenyl-3-azahexane 3-nitroxide (TIPNO). Conversely, other alkoxyamines derived from nitroxides conforming to the formula (1), especially those derived from nitroxides conforming to the formula (2) and more particularly those derived from N-tert-butyl 1-diethylphosphono-2,2-dimethylpropyl nitroxide, allow controlled radical polymerization to be extended to a large number of monomers.

Moreover, the opening temperature of the alkoxyamines also affects the economic factor. The use of low temperatures will be preferred in order to minimize the industrial difficulties. Preference will therefore be given to the alkoxyamines derived from nitroxides conforming to the formula (1), especially those derived from the nitroxides conforming to the formula (2), and even more particularly those derived from N-tert-butyl 1-diethylphosphono-2,2-dimethylpropyl nitroxide, to those derived from TEMPO or 2,2,5-trimethyl-4-phenyl-3-azahexane 3-nitroxide (TIPNO).

A gradient polymer means a polymer of at least two monomers which is obtained generally by living or pseudo-living polymerization. By virtue of these methods of polymerization, the polymer chains grow simultaneously and therefore at each moment incorporate the same ratios of comonomers. The distribution of the comonomers in the polymer chains therefore depends on the profile, during the synthesis, of the relative concentrations of the comonomers. Reference will be made to the following publications for a theoretical description of gradient polymers: T. Pakula & al., Macromol. Theory Simul. 5, 987-1006 (1996); A. Aksimetiev & al. J. of Chem. Physics 111, No. 5; M. Janco J. Polym. Sci., Part A: Polym. Chem. (2000), 38(15), 2767-2778; M. Zaremski, & al. Macromolecules (2000), 33(12), 4365-4372; K. Matyjaszewski & al., J. Phys. Org. Chem. (2000), 13(12), 775-786; Gray Polym. Prepr. (Am. Chem. Soc., Div. Polym. Chem.) (2001), 42(2), 337-338; K. Matyjaszewski, Chem. Rev. (Washington, D.C.) (2001), 101(9), 2921-2990.

The monomers which may be used in the composition of the polymers include the following:

At least one vinyl, vinylidene, diene, olefin, allyl or (meth)acrylic monomer. This monomer is selected more particularly from vinylaromatic monomers such as styrene or substituted styrenes, especially alpha-methylstyrene, acrylic monomers such as acrylic acid or its salts, alkyl, cycloalkyl or aryl acrylates such as methyl, ethyl, butyl, ethylhexyl or phenyl acrylate, hydroxyalkyl acrylates such as 2-hydroxyethyl acrylate, etheralkyl acrylates such as 2-methoxyethyl acrylate, alkoxy- or aryloxy-polyalkylene glycol acrylates such as methoxypolyethylene, glycol acrylates, ethoxypolyethylene glycol acrylates, methoxypolypropylene glycol acrylates, methoxypolyethylene glycol-polypropylene glycol acrylates, or mixtures thereof, aminoalkyl acrylates such as 2-(dimethylamino)ethyl acrylate (DMAEA), fluorine-containing acrylates, silyl-containing acrylates, phosphorus-containing acrylates such as alkylene glycol phosphate acrylates, glycidyl acrylates, dicyclopentenyloxyethyl acrylates, methacrylic monomers such as methacrylic acid or its salts, alkyl, cycloalkyl, alkenyl or aryl methacrylates such as methyl methacrylate (MMA), or lauryl, cyclohexyl, allyl, phenyl or naphthyl methacrylate, hydroxyalkyl methacrylates such as 2-hydroxyethyl methacrylate or 2-hydroxypropyl methacrylate, etheralkyl methacrylates such as 2-ethoxyethyl methacrylate, alkoxy- or aryloxy-polyalkylene glycol methacrylates such as methoxypolyethylene glycol methacrylates, ethoxypolyethylene glycol methacrylates, methoxypolypropylene glycol methacrylates, methoxypolyethylene glycol-polypropylene glycol methacrylates or mixtures thereof, aminoalkyl methacrylates such as 2-(dimethylamino)ethyl methacrylate (DMAEMA), fluorine-containing methacrylates such as 2,2,2-trifluoroethyl methacrylate, silyl-containing methacrylates such as 3-methacryloylpropyltrimethylsilane, phosphorus-containing methacrylates such as alkylene glycol phosphate methacrylates, hydroxyethylimidazolidone methacrylate, hydroxyethylimidazolidinone methacrylate, 2-(2-oxo-1-imidazolidinyl)ethyl methacrylate, acrylonitrile, acrylamide or substituted acrylamides, 4-acryloyl-morpholine, N-methylolacrylamide, methacrylamide or substituted methacrylamides, N-methylolmethacrylamide, methacrylamidopropyltrimethylammonium chloride (MAPTAC), glycidyl methacrylates, dicyclopentenyloxyethyl methacrylates, itaconic acid, maleic acid or its salts, maleic anhydride, alkyl or alkoxy- or aryloxypolyalkylene glycol maleates or hemimaleates, vinylpyridine, vinylpyrrolidinone, (alkoxy)poly(alkylene glycol) vinyl ethers or divinyl ethers, such as methoxypoly(ethylene glycol) vinyl ether, poly(ethylene glycol)divinyl ether, olefinic monomers, including ethylene, butene, hexene and 1-octene, diene monomers, including butadiene, isoprene, and also fluorine-containing olefinic monomers, and vinylidene monomers, including vinylidene fluoride, alone or in a mixture of at least two aforementioned monomers.

Preferably, the polymers consist of monomers among which mention may be made of styrene, methyl methacrylate, glycidyl methacrylate (GMA), 2-hydroxyethyl methacrylate (HEMA), methyl acrylate or ethyl acrylate. Styrene is present preferably in the polymers in molar amounts of from 40% to 100% and more preferably from 60% to 85%.

According to a first preferred embodiment of the invention, the random polymers have a weight-average molecular mass Mw, measured by SEC with polystyrene standards, of less than 20 000 g per mole, and more particularly less than 10 000 g/mol. The dispersity of the first polymer, this being the ratio of the weight-average molecular masses to the number-average molecular masses is less than 5, more particularly less than 2, and preferably less than 1.5.

According to a first aspect of the invention, the polymers have a weight-average molecular mass of less than 10 000 g/mol. According to a second aspect of the invention, the polymers have a weight-average molecular mass of greater than 10 000 g/mol.

When more than two polymers are used, they will be referred to as polymer i and polymer i+1, and they are selected as follows:
for hierarchical grafting, the weight-average molecular masses $M_w$ are selected such that the weight-average molecular mass $M_w$ of the polymer i+1 is less than the weight-average molecular mass $M_w$ of the polymer i.

For multiple grafting, the weight-average molecular masses $M_w$ of the copolymers will be equivalent.

According to one preferred embodiment of the invention, the random polymers of the invention are prepared with 2-methyl-2-[N-tert-butyl-N-(diethoxyphosphoryl-2,2-dimethylpropyl)aminoxy]propionic acid (Blocbuilder MA®-Arkema), styrene and methyl methacrylate.

The surface preparation method using the polymers of the invention is applicable to silicon, the silicon having a native or thermal oxide layer, hydrogenated or halogenated silicon, germanium, hydrogenated or halogenated germanium, platinum and platinum oxide, tungsten and oxides, gold, titanium nitrides, or graphenes. The surface is preferably mineral and more preferably is of silicon. Even more preferably, the surface is of silicon having a native or thermal oxide layer.

According to one preferred embodiment of the invention, the block polymers applied to the surfaces treated by the method of the invention are preferably diblock polymers or triblock polymers.

The method of the invention involves applying preferably the polymers dissolved or dispersed beforehand in an appropriate solvent, by techniques which are known to the skilled person, such as, for example, the technique known as spin coating, doctor blade, knife system or slot die system, although any other technique may be used, such as dry application, in other words application without involving dissolution beforehand.

The method of the invention is aimed at forming a grafted layer of polymer(s) of typically less than 10 nm and preferably less than 5 nm. When the method of the invention is used for preparing surfaces for the purpose of applying block polymer, the polymers will preferably be random polymers and the interaction energies with the blocks of the block copolymer or copolymers subsequently applied will be equivalent to that of the multitude of polymer layers applied or of the mixture of polymers applied.

According to a preferred embodiment of the invention, the polymers are grafted sequentially, that is to say one after another but grafting them in a combined manner is not excluded, that is to say that a mixture of the polymers is grafted.

The method of the invention may be used for controlling the structuring of block copolymers on a surface, enhancing the printability of inks or paint, the wettability, the weathering or ageing resistance, the adhesion, the biocompatibility, the prevention of migration of inks, the prevention of deposits of proteins, of soiling or of moulds.

Preferably, the method is used for controlling the structuring of a block copolymer.

Example 1

Preparation of a Hydroxy-Functionalized Alkoxyamine from the Commercial Alkoxyamine BlocBuilder® MA A 1 l round-bottomed flask purged with nitrogen is charged with:
226.17 g of BlocBuilder® MA (1 equivalent)
68.9 g of 2-hydroxyethyl acrylate (1 equivalent)
548 g of isopropanol.
The reaction mixture is heated at reflux (80° C.) for 4 hours and then the isopropanol is evaporated under vacuum. This gives 297 g of hydroxy-functionalized alkoxyamine in the form of a highly viscous yellow oil.

Example 2

Experimental Protocol for Preparing Polystyrene/Polymethyl Methacrylate Polymers from the Hydroxy-Functionalized Alkoxyamine Prepared According to Example 1

A stainless steel reactor equipped with a mechanical stirrer and a jacket is charged with toluene, and also with the monomers such as styrene (S), methyl methacrylate (MMA), and hydroxy-functionalized alkoxyamine. The mass ratios between the different styrene (S) and methyl methacrylate (MMA) monomers are described in Table 1. The mass charge of toluene is fixed at 30% relative to the reaction mixture. The reaction mixture is stirred and degassed by sparging of nitrogen at ambient temperature for 30 minutes.

The temperature of the reaction mixture is then raised to 115° C. The time t=0 begins at ambient temperature. The temperature is held at 115° C. throughout the polymerization, until a monomer conversion of the order of 70% is attained. Samples are taken at regular intervals in order to determine the kinetics of polymerization by gravimetry (measurement of dry extract).

When the conversion of 70% is attained, the reaction mixture is cooled to 60° C. and the solvent and residual monomers are evaporated under vacuum. Following evaporation, methyl ethyl ketone is added to the reaction mixture in an amount such as to produce a polymer solution of the order of 25% by mass.

This polymer solution is then introduced dropwise into a beaker containing a non-solvent (heptane), in order to precipitate the polymer. The mass ratio between solvent and non-solvent (methyl ethyl ketone/heptane) is of the order of ¹/₁₀. The precipitated polymer is recovered in the form of a white powder after filtration and drying.

sphere for a variable time. The substrate is then washed by sonication in a number of toluene baths for a few minutes in order to remove the ungrafted polymer from the surface, and then is dried under a stream of nitrogen.

Characterisations:

The film thickness measurements were performed on a Prometrix UV1280 ellipsometer. The images obtained by scanning electron microscopy were recorded on a CD-SEM H9300 from Hitachi.

In relation to measuring the number of defects, a methodology was developed. Accordingly, samples are structured beforehand with networks of lines/spaces, by "conventional" lithography (for example e-Beam, using a HSQ resin). The height of the resin units is h0, the width of the lines is L, and that of the trenches is S, as described in FIG. 1. The random polymer is subsequently grafted on these samples, as described above, and the block copolymer is structured by baking. The height of the copolymer film, h is greater than $h_0$, the height of the trench. It should be noted that h can be less than $h_0$, but preferably, in the method of the invention, h is greater than $h_0$. The PMMA phase is subsequently taken back preferentially in relation to the PS phase, and the surfaces are imaged using CD-SEM. The images thus obtained are subsequently processed using the algorithm described earlier on above, which is based on the constructions of Voronoï, taking account both of the calcu-

TABLE 1

| | Initial reaction state | | | | | | |
|---|---|---|---|---|---|---|---|
| | Initial composition by mass of the | Ratio by mass of alkoxyamine relative to the monomers | Caracteristics of the polymer | | | | |
| Polymers | monomers S/MMA | S and MMA | % PS[a] | Mp[a] | Mn[a] | Mw[a] | Ip[a] |
| A | 74/26 | 0.03 | 70% | 15 210 | 12 060 | 15 760 | 1.3 |
| B | 74/26/0/0 | 0.07 | 73% | 8 380 | 7 120 | 8 960 | 1.3 |

[a]Determined by size exclusion chromatography. The polymers are dissolved at 1 g/l in THF stablized with BHT.

Calibration is carried out using monodisperse polystyrene standards. Double detection by refractive index and UV at 254 nm makes it possible to determine the percentage of polystyrene in the polymer.

Example 3

Apart from the polymers described in Example 2, the block copolymer PS-b-PMMA (PS 46.1 kg·mol⁻¹, PMMA 21 kg·mol⁻¹, PDI=1.09) was purchased from Polymer Source Inc. (Dorval, Quebec) and used without subsequent purification.

Grafting on $SiO_2$:

Silicon plates (crystallographic orientation {100}) are cut by hand into pieces measuring 3×4 cm and are cleaned by piranha treatment ($H_2SO_4/H_2O_2$ 2:1 (v:v)) for 15 minutes, then rinsed with deionized water and dried in a stream of nitrogen just before functionalization. The remainder of the procedure is as described by Mansky & al. (*Science*, 1997, 1458), with a single modification (baking takes place in ambient atmosphere and not under vacuum). The random polymers are dissolved in toluene to give solutions at 1.5% by mass. A solution of PS-r-PMMA is dispensed by hand on to a freshly cleaned wafer, then spread by spin coating at 700 rpm, to give a film with a thickness of approximately 90 nm. The substrate is then simply placed on a hotplate, brought beforehand to the desired temperature, under ambient atmolation of the number of neighbours and of average distance between the neighbours. The defect minimum corresponds to a twin commensurability condition L=na0 and S=Na₀, where n and N are integers, and a0=√3/2L0, where L0 is the intrinsic period of the block copolymer.

Experimental Protocols:

The self-assembly method, the height of the lithographed units and the thickness of the block copolymer are constant throughout the samples produced, the only difference being in the grafting of the random copolymer(s) A and B.

On the histograms and the graphs plotted, each point is an average carried out over 10 photos taken randomly from the zone under consideration. Each photo measures a zone of the sample of 1350×1350 nm.

For the graphs relating to ellipsometry experiments, each point is an average formed from 7 different measurements.

In order to aid reading, the nomenclature used is as follows:

"A1"=random copolymer "A", grafted during time "t 1"

"A1A1"=random copolymer "A" grafted twice in succession during time "t 1"

"A1A1A1"=random copolymer "A" grafted three times in succession during time "t 1"

"A1B1"=grafting of random copolymer "A" during time "t 1", followed by grafting of random copolymer "B" during time "t 1"

The following times are used, unless specifically stated otherwise
time "t 1"=15 minutes
time "t 2"=30 minutes
time "t 3"=5 minutes
The temperature used for grafting is 240° C.
The following measurements (Table 2 and FIG. 2) of the number of defects were carried out on a rectangle measuring 1350×1350 nm:

TABLE 2

|  | Number of defects | Standard deviation |
|---|---|---|
| A1 | 159 | 37 |
| A 24h | 100 | 21 |
| A1A1 | 153 | 40 |
| A3 | 143 | 25 |
| A3A3 | 124 | 18 |
| A3A3A3 | 124 | 21 |
| A3A3A3A3 | 114 | 19 |
| B1 | 133 | 64 |
| B2 | 492 | 75 |
| B3 | 106 | 39 |
| B1B1 | 318 | 60 |
| B3B3 | 66 | 34 |
| B3B3B3 | 68 | 36 |
| B3B3B3B3 | 112 | 32 |
| B3B3B3B3B3 | 164 | 59 |
| A1B1 | 68 | 22 |
| B1A1 | 98 | 44 |
| B3A3 | 132 | 20 |
| A3B3 | 146 | 34 |
| A3A3B3B3 | 62 | 42 |

It is found that the best results are located at around 65 defects, and correspond:
to hierarchical grafting (A1B1)
to multiple grafting with the polymer of lowest molecular mass (B3B3, B3B3B3)
to combined multiple and hierarchical grafting (A3A3B3B3).

Furthermore, an optimum in the grafting number is observed and is situated above 4 for the polymer A of highest mass (FIG. 3), and between 2 and 3 (FIG. 4) for the polymer B of lowest mass.

It is noted that, during hierarchical grafting, it is preferable for the first polymer grafted to have a molecular mass greater than that of the second polymer grafted (A1B1 compared to B1A1).

Furthermore, when the parameter S in FIG. 1 varies from 182 to 190 nm, the optimum in terms of the number of layers grafted is always located around 3 (FIG. 5).

Lastly, the applicant has found that the thickness of the layers does not increase in the course of hierarchical or multiple grafting operations, thereby ensuring a consistency in the lithographic parameters until the block copolymer is applied, with the parameters h0, L and S in FIG. 1 remaining constant during multiple and hierarchical grafting operations. This is verified by measuring the thickness of residual polymer resulting from successive grafting operations (FIG. 6): this thickness remains of the order of one monomolecular layer of polymer, even when a number of grafting steps are carried out. Indeed, the thickness is even observed to exhibit a tendency to decrease slightly.

The invention claimed is:
1. Method for preparing a surface selected from silicon, silicon having a thermal or native oxide layer, germanium, platinum, tungsten, gold, titanium nitrides, graphenes, or BARC (bottom anti-reflecting coating), utilizing n random copolymers prepared by controlled radical polymerization, which are the same or different, n being an integer greater than or equal to 2, said method comprising the following n successive steps:
(a) contacting a solution or dispersion of polymer i, wherein i is the successive Integral values from 1 to n, with the surface to be treated, then evaporating a dissolution or dispersion solvent used for contacting the polymer i with the surface to be treated, followed by a step of chemical grafting polymer i to the surface;
(b) repeating step (a) with the polymer j=i+1 on the surface treated by the polymer i in step (a) until j=n; and
followed by applying a block copolymer on the surface thus treated.

2. Method according to claim 1, wherein the weight-average molecular mass of the polymers is less than 10 000 g/mol.

3. Method according to claim 1, wherein the weight-average molecular mass of the polymers is greater than 10 000 g/mol.

4. Method according to claim 2, wherein n is between 2 and 4 inclusive.

5. Method according to claim 3, wherein n is between 3 and 7 inclusive.

6. Method according to claim 4, wherein n is 3.

7. Method according to claim 1, wherein the grafting is carried out hierarchically.

8. Method according to claim 1, wherein the weight-average molecular mass of the polymer i+1 is less than that of the polymer i.

9. Method according to claim 1, wherein the grafting is carried out multiply.

10. Method according to claim 1, wherein adjacent grafted polymers have weight-average molecular masses exhibiting a difference of greater than or equal to 20%.

11. Method according to claim 1, wherein the polymers are prepared by nitroxide-controlled radical polymerization.

12. Method according to claim 11, wherein the nitroxides conform to the formula below:

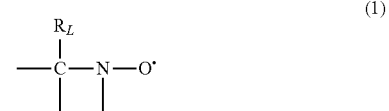

(1)

wherein the radical $R_L$ has a molar mass of more than 15.0342.

13. Method according to claim 12, wherein the nitroxides are selected from the group consisting of:
N-tert-butyl 1-phenyl-2-methylpropyl nitroxide,
N-tert-butyl 1-(2-naphthyl)-2-methylpropyl nitroxide,
N-tert-butyl 1-diethylphosphono-2,2-dimethylpropyl nitroxide,
N-tert-butyl 1-dibenzylphosphono-2,2-dimethylpropyl nitroxide,
N-phenyl 1-diethylphosphono-2,2-dimethylpropyl nitroxide,
N-phenyl 1-diethylphosphono-1-methylethyl nitroxide,
N-(1-phenyl-2-methylpropyl) 1-diethylphosphono-1-methylethyl nitroxide,
4-oxo-2,2,6,6-tetramethyl-1-piperidinyloxy, and
2,4,6-tri-tert-butylphenoxy.

14. Method according to claim 13, wherein the nitroxide is N-tert-butyl 1-diethylphosphono-2,2-dimethylpropyl nitroxide.

15. Method according to claim 1, wherein the random copolymers are composed of styrene and methyl methacrylate.

16. Method according to claim 1, wherein the surface is silicon having a native oxide layer.

17. Method according to claim 1, wherein the surface comprises a trench, and the height of the copolymer, h, is greater than $h_0$, the height of the trench.

18. Method according to claim 1, wherein the nanostructuring of the block copolymer, observed on the treated surface, has hexagonal cylindrical symmetry.

19. Method according to claim 1, wherein the step of chemical grafting comprising heat treatment or photochemical treatment.

20. Method for controlling the structuring of a block copolymer on a surface selected from silicon, silicon having a thermal or native oxide layer, germanium, platinum, tungsten, gold, titanium nitrides, graphenes, or BARC (bottom anti-reflecting coating), utilizing n random copolymers prepared by controlled radical polymerization, which are the same or different, wherein n is an integer greater than or equal to 2, said method comprising the following n successive steps:

(a) contacting a solution or dispersion comprising a dissolution or dispersion solvent and polymer i, wherein i is the successive integral values from 1 to n, with the surface to be treated, then evaporating the dissolution or dispersion solvent, followed by a step of chemically grafting polymer i the surface;

(b) repeating step (a) with the polymer j=i+1 on the surface treated by the polymer i in step (a) until j=n; and applying the block copolymer on the surface thus treated.

* * * * *